US012372592B2

(12) United States Patent
Takase

(10) Patent No.: US 12,372,592 B2
(45) Date of Patent: Jul. 29, 2025

(54) SENSOR DEVICE

(71) Applicant: Murata Manufacturing Co., Ltd., Nagaokakyo (JP)

(72) Inventor: Yasuhide Takase, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 158 days.

(21) Appl. No.: 18/386,351

(22) Filed: Nov. 2, 2023

(65) Prior Publication Data

US 2024/0061053 A1 Feb. 22, 2024

Related U.S. Application Data

(63) Continuation of application No. PCT/JP2022/018493, filed on Apr. 21, 2022.

(30) Foreign Application Priority Data

May 14, 2021 (JP) ................................ 2021-082737

(51) Int. Cl.
*G01R 33/00* (2006.01)
*G01R 33/06* (2006.01)

(52) U.S. Cl.
CPC ......... *G01R 33/0082* (2013.01); *G01R 33/06* (2013.01)

(58) Field of Classification Search
CPC .... G01R 33/0082; G01R 33/06; G01R 15/20; G01R 17/12; G01R 33/02; G01R 33/09; G01R 35/00
See application file for complete search history.

(56) References Cited

U.S. PATENT DOCUMENTS 5,327,078 A 7/1994 Mori
5,419,206 A 5/1995 Kamioka et al.
(Continued)

FOREIGN PATENT DOCUMENTS

EP 3220156 A1 9/2017
JP 03225223 A 10/1991
(Continued)

OTHER PUBLICATIONS

International Search Report in PCT/JP2022/018493, mailed Jul. 12, 2022, 4 pages.

(Continued)

*Primary Examiner* — Alvaro E Fortich
(74) *Attorney, Agent, or Firm* — Keating & Bennett, LLP

(57) ABSTRACT

A sensor device includes a bridge circuit, a bias circuit, and a detection signal receiving circuit. The bridge circuit includes four sensor elements connected in a bridge. The bias circuit includes an oscillation circuit and an averaging circuit. The oscillation circuit outputs an oscillation signal, in which an output voltage in a first output state and an output voltage in a second output state with temperature dependency repeat alternately at a predetermined ratio. The averaging circuit averages the output voltage of the oscillation circuit and applies the averaged output voltage as a bias voltage to a bias end of the bridge circuit. By applying this voltage, the bias circuit excites the bridge circuit and compensates for a temperature characteristic of the sensitivity by offsetting a temperature fluctuation due to a temperature change in its sensitivity.

15 Claims, 3 Drawing Sheets

1A
31 OSCILLATION CIRCUIT
32 AVERAGING CIRCUIT
3
Vbias
2
2a
R1
R3
4
2c
RECEIVING CIRCUIT
2d
R2
R4
2b

(56) References Cited

U.S. PATENT DOCUMENTS

| | | | | |
|---|---|---|---|---|
| 7,355,321 | B2 * | 4/2008 | Yamashita | G01P 15/09 310/317 |
| 2002/0083776 | A1 | 7/2002 | Tanizawa | |
| 2005/0285601 | A1 * | 12/2005 | Seto | G01R 17/105 324/526 |
| 2006/0250146 | A1 * | 11/2006 | Braun | G01L 1/2281 324/720 |
| 2014/0247090 | A1 * | 9/2014 | Reitsma | G01D 5/202 327/568 |
| 2017/0234701 | A1 * | 8/2017 | Reitsma | H03K 17/9542 324/655 |

FOREIGN PATENT DOCUMENTS

| | | | |
|---|---|---|---|
| JP | 0540847 | U | 6/1993 |
| JP | 08233867 | A | 9/1996 |
| JP | 2002148131 | A | 5/2002 |
| JP | 2004310584 | A | 11/2004 |
| JP | 2006017700 | A | 1/2006 |
| JP | 2017166890 | A | 9/2017 |
| WO | 2015146656 | A1 | 10/2015 |

OTHER PUBLICATIONS

Written Opinion in PCT/JP2022/018493, mailed Jul. 12, 2022, 4 pages.

* cited by examiner

SENSOR DEVICE

CROSS REFERENCE TO RELATED APPLICATIONS

This application claims the benefit of priority to Japanese Patent Application No. 2021-082737 filed on May 14, 2021 and is a Continuation Application of PCT Application No. PCT/JP2022/018493 filed on Apr. 21, 2022. The entire contents of each application are hereby incorporated herein by reference.

BACKGROUND OF THE INVENTION

1. Field of the Invention

The present disclosure relates to a sensor device including a function to compensate for a temperature characteristic of sensitivity of a bridge circuit including a sensor element.

2. Description of the Related Art

A conventional sensor device of this type includes, for example, a bridge detection circuit as disclosed in JP H08-233867A.

The sensor device includes a bridge circuit with one semiconductor magnetoresistance element and three reference resistors connected in a bridge, and amplifies, by an amplifier circuit, a detection signal detected by the bridge circuit. The output voltage amplified by the amplifier circuit is added synchronously with a constant power supply voltage by a synchronous addition circuit and is negatively fed back to a power supply input terminal of the bridge circuit. This negative feedback improves the linearity of the sensitivity of the bridge detection circuit. In addition, the constant power supply voltage input to the synchronous addition circuit is generated by a temperature compensation circuit including a transistor and a resistor, which provides temperature compensation in addition to linearity compensation of the sensitivity of the bridge detection circuit.

However, in the sensor device disclosed in JP H08-233867A, the temperature compensation of the sensitivity is performed by the temperature characteristic of the semiconductor magnetoresistance element and the temperature characteristic of the transistor that defines the temperature compensation circuit operating in directions opposite to each other. Therefore, it is difficult to perform the temperature compensation of the sensitivity of the bridge circuit when the temperature dependency of the semiconductor magnetoresistance element does not match the temperature characteristic of the transistor in directions opposite to each other. Even when the temperature dependency of the semiconductor magnetoresistance element matches the temperature characteristic of the transistor in directions opposite to each other, the sensitivity range that can be temperature compensated for is limited to a limited range that can be handled by the temperature characteristic of the transistor.

SUMMARY OF THE INVENTION

Preferred embodiments of the present invention provide sensor devices that each overcome one or more of the problems described above.

A sensor device according to a preferred embodiment of the present invention includes a bridge circuit including at least one sensor element with a characteristic that changes in accordance with a physical quantity to be detected, a detection signal receiving circuit to receive a sensor detection signal output from a detection signal output end of the bridge circuit in accordance with a change in the characteristic of the sensor element, an oscillation circuit to alternately output an output voltage of a first output state and an output voltage of a second output state at a predetermined ratio, at least one of the first output state and the second output state including temperature dependency on a time to maintain the state, and an averaging circuit to average output of the oscillation circuit to apply an averaged voltage to a bias end of the bridge circuit.

According to this configuration, an intermediate voltage between the output voltage of the first output state and the output voltage of the second output state, which are output from the oscillation circuit at a predetermined ratio and are averaged by the averaging circuit, is applied to the bias end of the bridge circuit as a bias voltage. Since at least one of the first output state and the second output state of each output voltage has temperature dependency on the time that maintains the state, the duty ratio of the bias voltage, which represents the time ratio between the first output state and the second output state, has temperature dependency on the denominator of the fraction of the time ratio. This temperature dependency is expressed as $1/(1+\alpha T)$, for example, where T is a temperature and $\alpha$ is a temperature coefficient. Therefore, when the sensor element has a first-order temperature dependency $(1+\alpha T)$ on a temperature, the temperature dependency of the bridge circuit is offset by the temperature dependency of the above bias voltage when the above bias voltage is applied to the bias end of the bridge circuit.

Therefore, by adjusting the time ratio between the first output state and the second output state of each output voltage and applying the bias voltage with a predetermined duty ratio to the bias end of the bridge circuit, the temperature compensation of the sensitivity of the bridge circuit can be performed arbitrarily over a wide sensitivity range without using a temperature characteristic of a specific semiconductor device such as a transistor as in the conventional device.

Therefore, preferred embodiments of the present invention are able to provide sensor devices that are each able to arbitrarily perform temperature compensation of sensitivity of a bridge circuit over a wide sensitivity range.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of sensor devices according to the present invention will be described with reference to the drawings.

Figure 1:
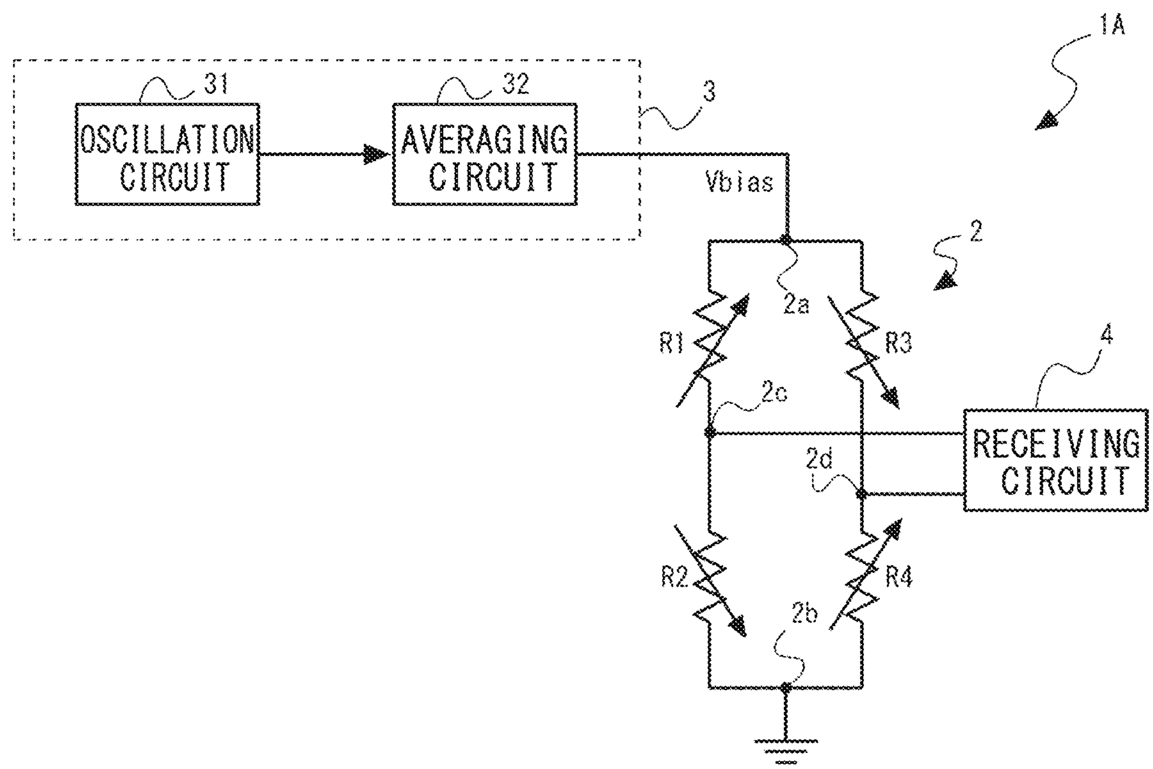
FIG. 1 is a circuit diagram showing a schematic configuration of a sensor device according to a first preferred embodiment of the present invention.

FIG. 1 is a circuit diagram showing a schematic configuration of a sensor device 1A according to a first preferred embodiment of the present invention.

The sensor device 1A includes a bridge circuit 2, a bias circuit 3, and a detection signal receiving circuit 4.

The bridge circuit 2 defines a sensor, and in the present preferred embodiment, the bridge circuit 2 includes four sensor elements R1, R2, R3, R4 connected in a bridge. Each sensor element R1, R2, R3, R4 includes a resistive element with magnetic sensitivity, for example, whose characteristic changes in accordance with a physical quantity to be detected. The sensor elements R1, R2, R3, R4 are represented in FIG. 1 by symbols with arrows attached to the resistance, indicating that the resistance value changes in accordance with the detected physical quantity. Such resistive elements include, for example, a tunnel magnetoresistance effect (TMR) element, an anisotropic magnetoresistance effect (AMR) element, and a hall element whose electrical resistance value changes in response to a change in the surrounding magnetic field due to the magnetoresistance effect. In the present preferred embodiment, the case in which the bridge circuit 2 includes the four sensor elements R1, R2, R3, R4 is described, but the bridge circuit 2 needs only at least one sensor element.

The connection point of the sensor element R1 and the sensor element R3, and the connection point of the sensor element R2 and the sensor element R4 define bias ends 2*a*, 2*b*, respectively, and a bias voltage Vbias is applied to the bias end 2*a* by the bias circuit 3, while the bias end 2*b* is grounded. The connection point between the sensor element R1 and the sensor element R2, and the connection point between the sensor element R3 and the sensor element R4 define detection signal output ends 2*c*, 2*d*, respectively, and a change in physical quantity detected by the sensor elements R1, R2, R3, R4 appears as a sensor detection signal at the detection signal output ends 2*c*, 2*d*. The resistance value of each sensor element R1, R2, R3, R4 is set to be equal or substantially equal.

The detection signal receiving circuit 4 receives sensor detection signals output from the detection signal output ends 2*c*, 2*d* of the bridge circuit 2 in response to changes in the characteristics of the sensor elements R1, R2, R3, R4. The detection signal receiving circuit 4, for example, includes an amplification circuit that receives and amplifies the sensor detection signals output from the detection signal output ends 2*c*, 2*d*, and outputs a detection output signal amplified from the sensor detection signals.

The bias circuit 3 excites the bridge circuit 2 by generating the bias voltage Vbias required to operate the bridge circuit 2. In the present preferred embodiment, the bias circuit 3 includes an oscillation circuit 31 and an averaging circuit 32 to excite the bridge circuit 2 and to compensate for the temperature characteristic of the sensitivity of the bridge circuit 2 by offsetting temperature fluctuation due to an ambient temperature change in the sensitivity of the bridge circuit 2.

Figure 2:
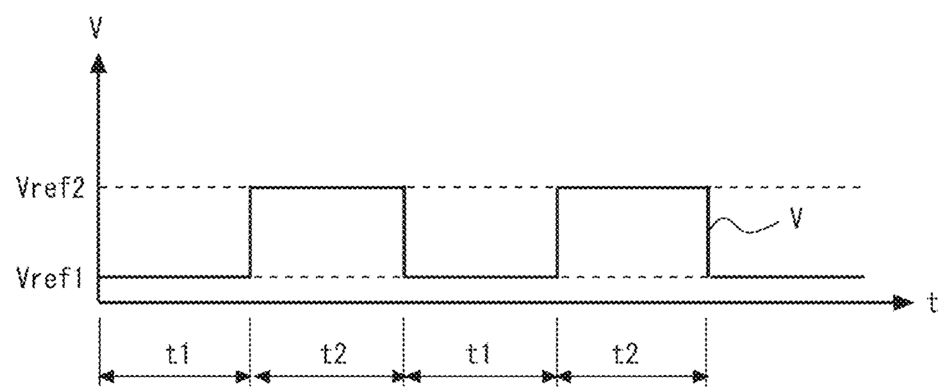
FIG. 2 is a graph showing a waveform of an oscillation signal output from an oscillation circuit that defines the sensor device according to the first preferred embodiment of the present invention.

The oscillation circuit 31, for example, outputs an oscillation signal V with a waveform shown in the graph of FIG. 2. The horizontal axis of the graph represents a time t, and the vertical axis represents the output voltage V of the oscillation circuit 31. The oscillation signal V has a waveform in which the output voltage Vref1 in the first output state and the output voltage Vref2 in the second output state repeat alternately at a predetermined ratio. At least one of the duration of the first output state of the output voltage Vref1 and the duration of the second output state of the output voltage Vref2 has temperature dependency. The duty ratio D of the oscillation signal V is expressed in the following equation (1), where t1 is a duration of the output voltage Vref1 in the first output state and t2 is a duration of the output voltage Vref2 in the second output state.

$$D=t2/(t1+t2) \tag{1}$$

The averaging circuit 32 includes, for example, a low pass filter, averages the output voltage of the oscillation circuit 31, and applies the averaged voltage to the bias end 2*a* of the bridge circuit 2 as the bias voltage Vbias.

According to the sensor device 1A of the present preferred embodiment, the intermediate voltage between the respective output voltages Vref1, Vref2 in the first output state and the second output state, which are output from the oscillation circuit 31 at a predetermined ratio and are averaged by the averaging circuit 32, is applied to the bias end 2*a* of the bridge circuit 2 as the bias voltage Vbias. Since at least one of the first output state and the second output state of each output voltage Vref1, Vref2 has temperature dependency on the time that maintains the state, this bias voltage Vbias is proportional to the duty ratio D, which represents the time ratio between the first output state and the second output state as in the equation (1), and the denominator of the fraction of the duty ratio D has temperature dependency. This temperature dependency is expressed, for example, as $1/(1+\alpha T)$, where T is a temperature and $\alpha$ is a temperature coefficient.

Therefore, when the sensor elements R1, R2, R3, R4 have first order temperature dependency $(1+\alpha T)$ on a temperature, by applying the above bias voltage Vbias to the bias end 2*a* of the bridge circuit 2, the temperature dependency S of the sensor detection signal appearing at the detection signal output ends 2*c*, 2*d* of the bridge circuit 2, in other words, the temperature dependency S of the sensitivity of the bridge circuit 2 is offset by the temperature dependency $1/(1+\alpha T)$ of the bias voltage Vbias, as expressed in the following equation (2).

$$S=\{1/(1+\alpha T)\}\times(1+\alpha T)=1 \tag{2}$$

Therefore, according to the sensor device 1A of the present preferred embodiment, by adjusting the time ratio between the first output state and the second output state of each output voltage Vref1, Vref2 and applying the bias voltage Vbias proportional to a predetermined duty ratio D to the bias end 2*a* of the bridge circuit 2, the temperature compensation of the sensitivity of the bridge circuit 2 can be arbitrarily performed over a wide sensitivity range without using a temperature characteristic of a specific semiconductor device, such as a transistor as in the conventional device.

Figure 3:
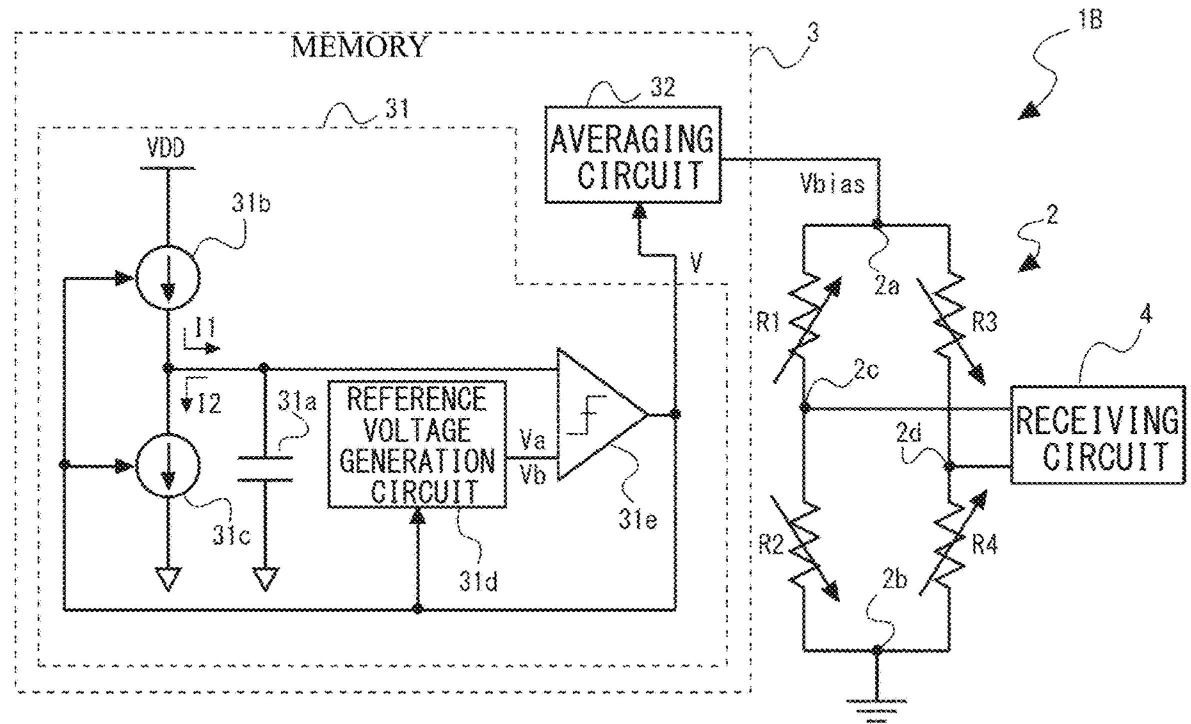
FIG. 3 is a circuit diagram showing a schematic configuration of a sensor device according to a second preferred embodiment of the present invention.

FIG. 3 is a circuit diagram showing a schematic configuration of a sensor device 1B according to a second preferred embodiment of the present invention. In FIG. 3, the same or equivalent portions to those in FIG. 1 are denoted by the same symbols and their descriptions are omitted.

The sensor device 1B according to the second preferred embodiment includes an oscillation circuit 31 including a capacitance 31*a*, a first control current source 31*b*, a second control current source 31*c*, a reference voltage generation circuit 31*d*, and a comparison circuit 31*e*. Other configurations are the same as or similar to the sensor device 1A according to the first preferred embodiment.

The capacitance 31*a* includes one end connected to a predetermined DC potential and the other end connected to the first control current source 31*b* and the second control current source 31*c*. The first control current source 31*b* injects a predetermined source current I1 into the other end of the capacitance 31*a* when the output voltage V of the oscillation circuit 31 is the first output state at the voltage Vref1. The second control current source 31*c* sucks a predetermined sink current I2 from the other end of the capacitance 31*a* when the output voltage V of the oscillation circuit 31 is in the second output state at a voltage Vref2. The reference voltage generation circuit 31*d* generates reference voltages Va, Vb according to the output state of the oscillation circuit 31. That is, the reference voltage generation circuit 31*d* generates the reference voltage Va when the output state of the oscillation circuit 31 is the first output state, and generates the reference voltage Vb when the output state of the oscillation circuit 31 is the second output state. The comparison circuit 31*e* compares the voltage at the other end of the capacitance 31*a* with the reference voltage Va, Vb output from the reference voltage generation circuit 31*d* to determine the output state of the oscillation circuit 31 as either the first output state or the second output state.

In the sensor device 1B of the second preferred embodiment, the first control current source 31*b* and the second control current source 31*c* are controlled by the output voltage V of the oscillation circuit 31. When the output of the oscillation circuit 31 is the first output state, the first control current source 31*b* injects the source current I1 into the other end of the capacitance 31*a*. The injection of the source current I1 into the other end of the capacitance 31*a* increases the voltage at the other end of the capacitance 3*a* with the passage of time. When the voltage at the other end of the capacitance 3*a* increases due to the injection of the source current I1 into the capacitance 31*a* by the first control current source 31*b* and reaches the reference voltage Va that the reference voltage generation circuit 31*d* generates according to the first output state of the oscillation circuit 31, the output state of the oscillation circuit 31 is shifted to the second output state by the comparison circuit 31*e*. The reference voltage generation circuit 31*d* is controlled by the output voltage V of the oscillation circuit 31.

When the output state of the oscillation circuit 31 switches from the first output state to the second output state, the sink current I2 is sucked out from the other end of the capacitance 31*a* by the second control current source 31*c*. As the sink current I2 is sucked out from the other end of the capacitance 31*a*, the voltage at the other end of the capacitance 3*a* reduces with the passage of time. When the voltage at the other end of the capacitance 3*a* reaches the reference voltage Vb generated by the reference voltage generation circuit 31*d* according to the second output state of the oscillation circuit 31 due to this voltage reduction, the output state of the oscillation circuit 31 is shifted to the first output state by the comparison circuit 31*e*.

The output state of the oscillation circuit 31 alternately switches between the first output state and the second output state at a predetermined duty ratio D as the above operation is repeated with the current injection into and the current suction from the capacitance 31*a*. Therefore, according to the sensor device 1B of the second preferred embodiment, the bias voltage Vbias proportional to the predetermined duty ratio D according to a temperature can be applied to the bias end 2*a* of the bridge circuit 2 with a simple circuit configuration.

This duty ratio D can be calculated as follows when the sensor elements R1, R2, R3, R4 are, for example, TMR elements. A voltage Vout output by the TMR element for the applied magnetic field B is proportional to both the voltage Vbias applied to the TMR element and the flux sensitivity δ of the TMR element, and is expressed in the following equation (3).

$$V\text{out}=\delta\cdot V\text{bias}\cdot B \tag{3}$$

When the magnetic flux sensitivity δ has a first order temperature coefficient Tc1[ppm/K], in order to obtain the temperature-independent output voltage Vout from the TMR element by offsetting the temperature variation of the TMR element, the voltage Vbias applied to the TMR element is a voltage Vbias(T) having temperature dependency expressed as a function of a temperature T in the following equation (4), where a voltage V0 is the value of the voltage Vbias applied to the TMR element at a room temperature.

$$V\text{bias}(T)=\{1/(1+Tc1)\}\times V0 \tag{4}$$

The time t1 of the first output state and the time t2 of the second output state of the oscillation signal V output from the oscillation circuit 31 with the waveform shown in FIG. 2 by charging and discharging the capacitance 31*a* with the source current I1 and the sink current I2 are expressed in the following equations (5), (6), respectively, where C0 is a capacitance value of the capacitance 31*a* and τcd is a comparison delay time in the comparison circuit 31*e*.

$$t1=\{C0(V\text{ref2}-V\text{ref1})/I1\}+Tcd \tag{5}$$

$$t2=\{C0(V\text{ref2}-V\text{ref1})/I2\}+Tcd \tag{6}$$

Therefore, the duty ratio D of the oscillation signal V output from the oscillation circuit 31 as shown in FIG. 2 is calculated from the equation (1) by the following equation (7).

$$D=t2/(t1+t2)=[1+\{\tau cd\cdot I2/C0(V\text{ref2}-V\text{ref1})\}]/[1+12/I1+\{2\tau cd\cdot I2/C0(V\text{ref2}-V\text{ref1})\}] \tag{7}$$

Here, for simplicity, when the comparison delay time τcd in the comparison circuit 31*e* is set to 0 as sufficiently small, the duty ratio D is expressed in the following equation (8).

$$D=1/(1+I2/I1) \tag{8}$$

By averaging the oscillation signal V with the duty ratio D in the averaging circuit 32, the bias voltage Vbias proportional to the duty ratio D is obtained. In the equation (8) above, when the sink current I2 is a current proportional to a temperature and the second output state of the second output voltage Vref2 has temperature dependency, and the source current I1 is a current without temperature dependency and the first output state of the first output voltage Vref1 does not have temperature dependency, the denominator of the fraction of the duty ratio D has temperature dependency 1/(1+αT). Therefore, the first order temperature dependency (1+αT) that the sensor elements R1, R2, R3, R4 have on a temperature, that is, the temperature dependency S of the sensitivity of the bridge circuit 2, is offset by the temperature dependency 1/(1+αT) that the bias voltage Vbias has, as expressed in the equation (2) above.

Therefore, the sensor device 1B of the second preferred embodiment has the same or substantially the same advantageous effects as the sensor device 1A of the first preferred embodiment, and enables the temperature compensation of the sensitivity of the bridge circuit 2 over a wide sensitivity range with high accuracy and a simple circuit configuration without using a temperature characteristic of a specific semiconductor element, such as a transistor as in the conventional device.

Figure 4:
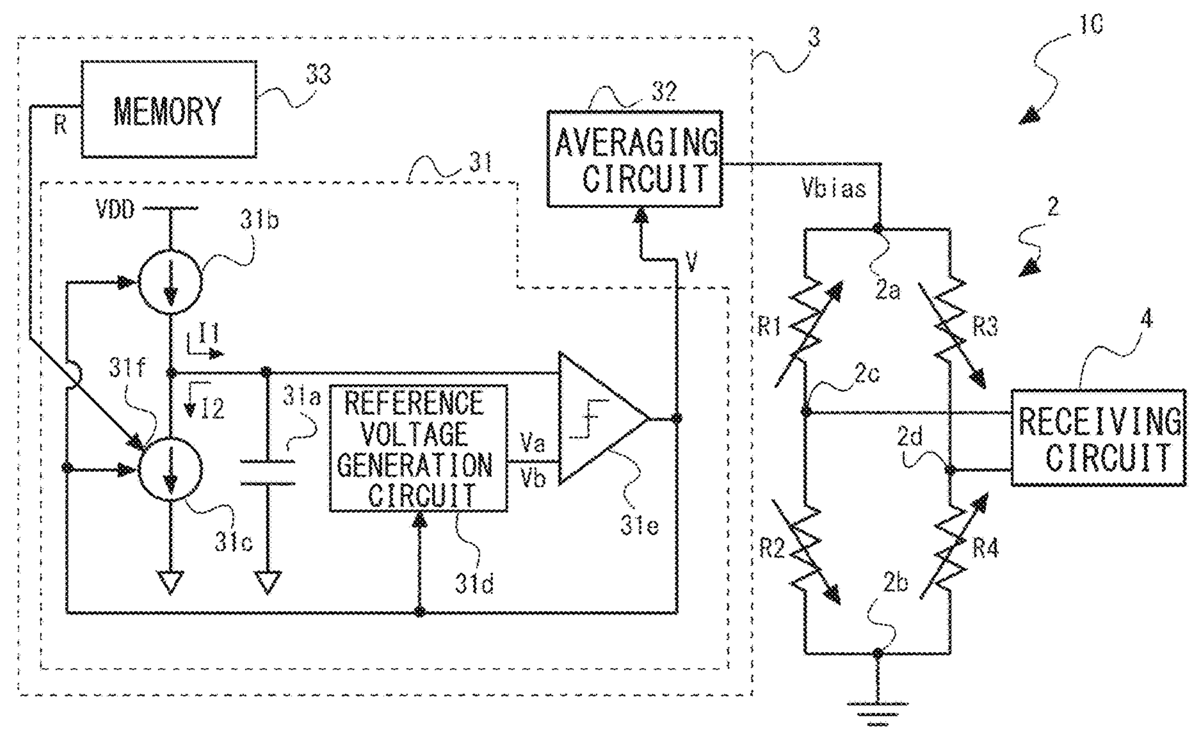
FIG. 4 is a circuit diagram showing a schematic configuration of a sensor device according to a third preferred embodiment of the present invention.

FIG. 4 is a circuit diagram showing a schematic configuration of a sensor device 1C according to a third preferred embodiment of the present invention. In FIG. 4, the same or equivalent portions to those in FIG. 3 are denoted by the same symbols and their descriptions are omitted.

The sensor device 1C according to the third preferred embodiment includes a temperature dependency adjustment input terminal 31*f* in the second control current source 31*c*, and the bias circuit 3 includes a memory 33. The other configuration is the same as or similar to the sensor device 1B according to the second preferred embodiment. A temperature dependency adjustment signal R to adjust the sink current I2 is input to the temperature dependency adjustment input terminal 31*f* provided in the second control current source 31*c*. The memory 33 stores the temperature dependency adjustment signal R.

According to the sensor device 1C of the third preferred embodiment, the temperature dependency adjustment signal R to be input from the memory 33 to the temperature dependency adjustment input terminal 31*f* provided in the second control current source 31*c* can be a signal in accordance with the individual variations of the bridge circuit 2. By making the temperature dependency adjustment signal R to be input to the temperature dependency adjustment input terminal 31*f* in accordance with the individual variations of the bridge circuit 2, the sink current I2 sucked from the capacitance 31*a* by the second control current source 31*c* is set to a value that offsets the individual variations. This adjusts the temperature dependency of the duration time t2 of the second output state, and the duty ratio D of the oscillation signal V is adjusted to a duty ratio that offsets the temperature dependency including individual variations.

Therefore, according to the sensor device 1C of the third preferred embodiment, it is possible to apply the bias voltage Vbias in accordance with the temperature and the individual variations to the bias end 2*a* of the bridge circuit 2. Therefore, the sensor device 1C of the third preferred embodiment has the same or substantially the same advantageous effects as the sensor device 1A of the first preferred embodiment, and enables the temperature compensation of the sensitivity of the bridge circuit 2 arbitrarily and accurately over a wide sensitivity range with a simple circuit configuration without using a temperature characteristic of a specific semiconductor element such as a transistor as in the conventional device.

In the third preferred embodiment, the temperature dependency adjustment input terminal 31*f* is provided in the second control current source 31*c*, and the memory 33 is configured to store the temperature dependency adjustment signal R to be input to the temperature dependency adjustment input terminal 31*f*. However, the temperature dependency adjustment input terminal 31*f* needs only to be provided in at least one of the first control current source 31*b*, to which the temperature dependency adjustment signal R to adjust the predetermined source current I1 is input, or the second control current source 31*c*, to which the temperature dependency adjustment signal R to adjust the predetermined sink current I2 is input. The memory 33 should store the temperature dependency adjustment signal R of at least one of the first control current source 31*b* and the second control current source 31*c*.

In the configuration of this modified example, the temperature dependency adjustment signal R to be input from the memory 33 to the temperature dependency adjustment input terminal 31*f* provided in the first control current source 31*b* or to the temperature dependency adjustment input terminal 31*f* provided in the second control current source 31*c* can be adjusted to a signal according to the individual variations of the bridge circuit 2. By adjusting the temperature dependency adjustment signal R input to each temperature dependency adjustment input terminal 31*f* according to the individual variations of the bridge circuit 2, the source current I1 or the sink current I2 is set to offset the individual variations of the bridge circuit 2. This adjusts the duration time t1 or t2 of the first output state or the second output state so that the temperature dependency of the bias voltage Vbias is adjusted to offset the individual variations of the bridge circuit 2.

Therefore, this modified example has the same or substantially the same advantageous effects as the sensor device 1C according to the third preferred embodiment, and enables the temperature compensation of the sensitivity of the bridge circuit 2 to be performed arbitrarily and accurately over a wide sensitivity range with a simple circuit configuration.

Figure 5:
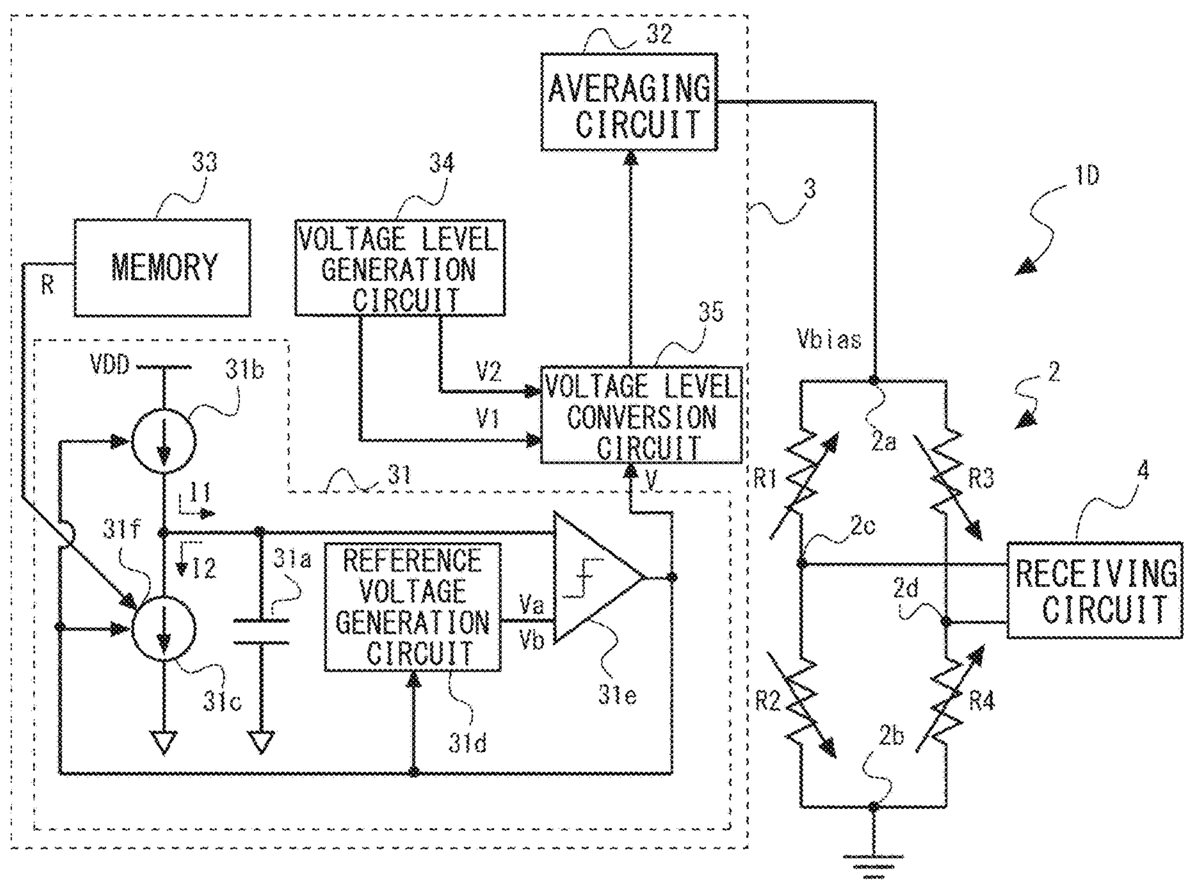
FIG. 5 is a circuit diagram showing a schematic configuration of a sensor device according to a fourth preferred embodiment of the present invention.

FIG. 5 is a circuit diagram showing a schematic configuration of a sensor device 1D according to a fourth preferred embodiment of the present disclosure. In FIG. 5, the same or equivalent portions to those in FIG. 4 are denoted by the same symbols and their descriptions are omitted.

In the sensor device 1D according to the fourth preferred embodiment, the bias circuit 3 includes a voltage level generation circuit 34 and a voltage level conversion circuit 35. The other configuration is the same as or similar to the sensor device 1C according to the third preferred embodiment. The voltage level generation circuit 34 generates a first level voltage V1 and a second level voltage V2 with a higher voltage level than the first level voltage V1. The voltage level conversion circuit 35 converts the output voltage Vref1 in the first output state output by the oscillation circuit 31 into the first level voltage V1 generated by the voltage level generation circuit 34, and the output voltage Vref2 in the second output state output by the oscillation circuit 31 into the second level voltage V2 generated by the voltage level generation circuit 34.

According to the fourth preferred embodiment of the sensor device 1D, the respective output voltages Vref1, Vref2 of the first and second output states output by the oscillation circuit 31 are converted by the voltage level conversion circuit 35 into the first level voltage V1 and the second level voltage V2 generated by the voltage level generation circuit 34. Therefore, the magnitude of the bias voltage Vbias applied to the bias end 2*a* of the bridge circuit 2 is proportional to the voltage difference (=V2−V1) between the first level voltage V1 and the second level voltage V2. Therefore, the sensor detection signal output from the detection signal output ends 2*c*, 2*d* of the bridge circuit 2, i.e., the magnitude of the sensitivity of the bridge circuit 2, is also proportional to the voltage difference between the first level voltage V1 and the second level voltage V2.

Therefore, according to the sensor device 1D of the fourth preferred embodiment, the temperature compensation of the sensitivity of the bridge circuit 2 can be arbitrarily and accurately performed over a wide sensitivity range with a simple circuit, and the magnitude of the sensitivity of the bridge circuit 2 can be proportional to the voltage difference between the first level voltage V1 and the second level voltage V2 generated by the voltage level generation circuit 34.

In the fourth preferred embodiment, by configuring the voltage level generation circuit 34 to generate the first level voltage V1 and the second level voltage V2, where the voltage difference is proportional to the supply voltage VDD, the bias voltage Vbias output from the averaging circuit 32 is expressed by the following equation (9) when the duty ratio D of the oscillation signal V output from the oscillation circuit 31 is shown in equation (8).

$$V\mathrm{bias}=VDD/(1+I2/I1) \quad (9)$$

Therefore, according to this modified example, the magnitude of the sensitivity of the bridge circuit 2 is proportional to the supply voltage VDD. Therefore, the sensor device 1D can provide a ratiometric bridge sensitivity that is proportional to the variation of the supply voltage VDD.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A sensor device comprising:

a bridge circuit including at least one sensor element with a characteristic that changes in accordance with a physical quantity to be detected;

a detection signal receiving circuit to receive a sensor detection signal output from a detection signal output end of the bridge circuit in accordance with a change in the characteristic of the sensor element;

an oscillation circuit to alternately output an output voltage of a first output state and an output voltage of a second output state at a predetermined ratio, at least one of the first output state and the second output state having temperature dependency on a time to maintain the state; and an averaging circuit to average output of the oscillation circuit and apply an averaged voltage to a bias end of the bridge circuit.

2. The sensor device according to claim 1, wherein the oscillation circuit includes:

a capacitance including one end connected to a predetermined DC potential;

a first control current source to inject a predetermined source current into another end of the capacitance when the output voltage of the oscillation circuit is the first output state;

a second control current source to suck a predetermined sink current from the another end of the capacitance when the output voltage of the oscillation circuit is the second output state;

a reference voltage generation circuit to generate a reference voltage in accordance with an output state of the oscillation circuit; and a comparison circuit to compare voltage at the another end of the capacitance with the reference voltage output from the reference voltage generation circuit to determine the output state of the oscillation circuit to either the first output state or the second output state.

3. The sensor device according to claim 2, further comprising:

at least one of a temperature dependency adjustment input terminal in the first control current source to which a temperature dependency adjustment signal to adjust the predetermined source current is input, or a temperature dependency adjustment input terminal in the second control current source to which a temperature dependency adjustment signal to adjust the predetermined sink current is input; and a memory to store at least one of the temperature dependency adjustment signals.

4. The sensor device according to claim 1, further comprising:

a voltage level generation circuit to generate a first level voltage and a second level voltage; and a voltage level conversion circuit to convert the output voltage of the first output state output by the oscillation circuit to the first level voltage generated by the voltage level generation circuit and the output voltage of the second output state output by the oscillation circuit to the second level voltage generated by the voltage level generation circuit.

5. The sensor device according to claim 4, wherein the voltage level generation circuit is operable to generate the first level voltage and the second level voltage in which a voltage difference is proportional to a power supply voltage.

6. The sensor device according to claim 1, wherein the sensor element is a resistive element with magnetic sensitivity.

7. The sensor device according to claim 1, wherein the bridge circuit includes four sensor elements connected in a bridge.

8. The sensor device according to claim 6, wherein the resistive element is one of a tunnel magnetoresistance effect element, an anisotropic magnetoresistance effect element, or a hall element.

9. The sensor device according to claim 1, wherein the detection signal receiving circuit includes an amplification circuit to receive and amplify the sensor detection signals from a detection signal output end of the bridge circuit.

10. The sensor device according to claim 1, further comprising a bias circuit to excite the bridge circuit by generating a bias voltage to operate the bridge circuit.

11. The sensor device according to claim 10, wherein the bias circuit includes an oscillation circuit and an averaging circuit to excite the bridge circuit.

12. The sensor device according to claim 11, wherein the averaging circuit includes a low pass filter.

13. The sensor device according to claim 1, wherein the oscillation circuit includes a capacitor, a first control circuit source, a second control circuit source, a reference voltage generation circuit, and a comparison circuit.

14. The sensor device according to claim 10, wherein the bias circuit includes a memory.

15. The sensor device according to claim 10, wherein the bias circuit includes a voltage level generation circuit and a voltage level conversion circuit.

* * * * *